United States Patent
Tsai et al.

(10) Patent No.: US 8,370,774 B2
(45) Date of Patent: Feb. 5, 2013

(54) CONSTRUCTING MAPPING BETWEEN MODEL PARAMETERS AND ELECTRICAL PARAMETERS

(75) Inventors: Chen-Ming Tsai, Zhunan Township (TW); Ke-Wei Su, Zhubei (TW); Cheng Hsiao, Hsin-Chu (TW); Min-Chie Jeng, Keelung (TW); Jia-Lin Lo, Zhongli (TW); Feng-Ling Hsiao, Xinying (TW); Yi-Shun Huang, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 170 days.

(21) Appl. No.: 12/871,683

(22) Filed: Aug. 30, 2010

(65) Prior Publication Data
US 2012/0054709 A1    Mar. 1, 2012

(51) Int. Cl.
*G06F 17/50* (2006.01)
*G06F 17/16* (2006.01)
*G06F 17/10* (2006.01)

(52) U.S. Cl. .......... 716/54; 716/111; 716/132; 716/136; 703/2; 703/14

(58) Field of Classification Search ............... 716/54, 716/111, 132, 136; 703/2, 14
See application file for complete search history.

(56) References Cited

U.S. PATENT DOCUMENTS

| | | | | |
|---|---|---|---|---|
| 5,792,072 A * | 8/1998 | Keefe | .............. | 600/559 |
| 6,581,028 B1 * | 6/2003 | Hayashi | ............. | 703/13 |
| 6,937,032 B2 * | 8/2005 | Adamian | ............. | 324/683 |
| 7,003,744 B2 * | 2/2006 | Weller et al. | ............. | 716/103 |
| 7,292,968 B2 | 11/2007 | Wu et al. | | |
| 7,505,879 B2 * | 3/2009 | Tomoyasu et al. | ............. | 703/2 |
| 7,590,518 B2 * | 9/2009 | Phillips | ............. | 703/13 |
| 7,623,995 B2 * | 11/2009 | Yechuri | ............. | 703/2 |
| 7,640,143 B2 * | 12/2009 | Bittner et al. | ............. | 703/2 |
| 8,134,494 B1 * | 3/2012 | Isom et al. | ............. | 342/170 |
| 8,185,853 B2 * | 5/2012 | Kim et al. | ............. | 716/107 |
| 2002/0007261 A1 * | 1/2002 | Ochi et al. | ............. | 703/14 |
| 2002/0116691 A1 * | 8/2002 | Tsai | ............. | 716/4 |
| 2003/0101418 A1 * | 5/2003 | Draxler et al. | ............. | 716/1 |
| 2003/0149555 A1 * | 8/2003 | Sonoda | ............. | 703/15 |
| 2004/0015793 A1 * | 1/2004 | Saxena et al. | ............. | 716/4 |
| 2004/0235304 A1 * | 11/2004 | Oh | ............. | 438/689 |
| 2005/0143952 A1 * | 6/2005 | Tomoyasu et al. | ............. | 702/181 |
| 2005/0198603 A1 * | 9/2005 | Chang et al. | ............. | 716/8 |
| 2006/0282802 A1 * | 12/2006 | Yechuri | ............. | 716/4 |
| 2007/0233447 A1 * | 10/2007 | Miyata et al. | ............. | 703/14 |
| 2009/0019408 A1 * | 1/2009 | Saito et al. | ............. | 716/5 |

(Continued)

FOREIGN PATENT DOCUMENTS
CN         101135707 A  *  3/2008

OTHER PUBLICATIONS

Chen et al.,"Mlnimizing Leakage Power in Aging-Bounded High-Level Synthesis with Design Time Multi-Vth Assignment", 2010 15th Asia and South Pacific Design Automation Conference, Jan. 18-21, 2010, pp. 689-694.*

(Continued)

*Primary Examiner* — Phallaka Kik
(74) *Attorney, Agent, or Firm* — Slater & Matsil, L.L.P.

(57) ABSTRACT

A method includes determining a mapping between model parameters and electrical parameters of integrated circuits. The model parameters are configured to be used by a simulation tool. A set of electrical parameters is provided, and the mapping is used to map the set of electrical parameters to a set of model parameters.

20 Claims, 10 Drawing Sheets

U.S. PATENT DOCUMENTS

2010/0076741 A1*  3/2010  Takeuchi ........................ 703/14
2010/0185422 A1*  7/2010  Hoversten ....................... 703/2
2010/0199237 A1*  8/2010  Kim et al. ....................... 716/3

OTHER PUBLICATIONS

Chung et al., "Accurate MOS Device Hot Carrier Models for VLSI Reliability Simulation", Proceedings of the IEEE 1995 Custom Integrated Circuits Conference, May 1-4, 1995, pp. 233-236.*

Das et al., "Age Replacement of Components During IFR Delay Time", IEEE Transactions on Reliability, vol. 53, No. 3, Sep. 2004, pp. 306-312.*

Li et al., "A New SPICE Reliability Simulation Method for Deep Submicrometer CMOS VLSI Circuits", IEEE Transactions on Device and Materials Reliability, vol. 6, No. 2, Jun. 2006, pp. 247-257.*

Abdi, H., "Partial Least Square Regression PLS-Regression," The University of Texas at Dallas, 2007, 13 pgs.

Bradley, N., "The Response Surface Methodology," Indiana University of South Bend, 2007, 84 pgs.

Morshed, T.H., et al., "BSIM4.6.4 MOSFET Model—User's Manual," UC Berkeley, 2009, 179 pgs.

"http://en.wikipedia.org/wiki/Response_surface_methodology," Wikipedia [Online], Downloaded Aug. 27, 2010, 4 pgs.

"http://sumo.intec.ugent.be/?g=SUMO_toolbox," Universiteit Gent [Online], Downloaded Aug. 27, 2010, 3 pgs.

* cited by examiner

Input Variables   Ouput Variables $$\begin{bmatrix} Vthlin \\ idlin \\ idsat \\ DIBL \end{bmatrix} \Rightarrow \begin{bmatrix} VTHO \\ UO \\ VSAT \\ ETAO \end{bmatrix} = \begin{bmatrix} F_{VTHO}(Idsat,Idlin,Vthlin,DIBL,Tempr) \\ F_{UO}(Idsat,Idlin,Vthlin,DIBL,Tempr) \\ F_{VSAT}(Idsat,Idlin,Vthlin,DIBL,Tempr) \\ F_{ETAO}(Idsat,Idlin,Vthlin,DIBL,Tempr) \end{bmatrix}$$

Fig. 4

$$P \begin{Bmatrix} \begin{bmatrix} VTHO \\ UO \\ VSAT \\ ETAO \\ \vdots \end{bmatrix} \end{Bmatrix} = \begin{bmatrix} r_{1,1} & r_{1,2} & r_{1,3} & r_{1,4} & r_{1,5} & r_{1,6} & r_{1,7} & r_{1,8} \cdots \\ r_{21} & r_{22} & r_{23} & r_{24} & r_{25} & r_{26} & r_{27} & r_{28} \\ r_{31} & r_{32} & r_{33} & r_{34} & r_{35} & r_{36} & r_{37} & r_{38} \\ r_{41} & r_{42} & r_{43} & r_{44} & r_{45} & r_{46} & r_{47} & r_{48} \\ \vdots & & & & & & & \end{bmatrix}_{R} \begin{Bmatrix} \begin{bmatrix} Vth \\ Idlin \\ Idsat \\ DIBL \\ F_1(Vth, Idlin, Idsat, DIBL) \\ F_2(Vth, Idlin, Idsat, DIBL) \\ F_3(Vth, Idlin, Idsat, DIBL) \\ F_4(Vth, Idlin, Idsat, DIBL) \\ \vdots \end{bmatrix} \end{Bmatrix}_{E}$$

Fig. 5A $$\Delta E \begin{cases} \begin{bmatrix} dVth \\ dIdlin \\ dIdsat \\ dDIBL \\ F_{dVth}\,(dVth) \\ F_{dIdlin}\,(dIdlin) \\ F_{dIdsat}\,(dIdsat) \\ F_{dIoff}\,(dDIBL) \\ \vdots \end{bmatrix} \end{cases}$$

$$\Delta P \begin{cases} \begin{bmatrix} dVTH0 \\ dU0 \\ dVSAT \\ dETA0 \\ \vdots \end{bmatrix} \end{cases} = \overbrace{\begin{bmatrix} r_{1,1} & r_{1,2} & r_{1,3} & r_{1,4} & r_{1,5} & r_{1,6} & r_{1,7} & r_{1,8} & \cdots \\ r_{21} & r_{22} & r_{23} & r_{24} & r_{25} & r_{26} & r_{27} & r_{28} \\ r_{31} & r_{32} & r_{33} & r_{34} & r_{35} & r_{36} & r_{37} & r_{38} \\ r_{41} & r_{42} & r_{43} & r_{44} & r_{45} & r_{46} & r_{47} & r_{48} \\ \vdots & & & & & & & \end{bmatrix}}^{R}$$

Fig. 5B $$\Delta P \begin{cases} \begin{bmatrix} dVTHO \\ dUO \\ dVSAT \\ dETAO \end{bmatrix} = \begin{bmatrix} r_{1,1} & r_{1,2} & r_{1,3} & r_{1,4} & r_{1,5} & r_{1,6} & r_{1,7} & r_{1,8} & r_{1,9} & r_{1,10} & r_{1,11} & r_{1,12} \\ r_{2,1} & r_{2,2} & r_{2,3} & r_{2,4} & r_{2,5} & r_{2,6} & r_{2,7} & r_{2,8} & r_{2,9} & r_{2,10} & r_{2,11} & r_{2,12} \\ r_{3,1} & r_{3,2} & r_{3,3} & r_{3,4} & r_{3,5} & r_{3,6} & r_{3,7} & r_{3,8} & r_{3,9} & r_{3,10} & r_{3,11} & r_{3,12} \\ r_{4,1} & r_{4,2} & r_{4,3} & r_{4,4} & r_{4,5} & r_{4,6} & r_{4,7} & r_{4,8} & r_{4,9} & r_{4,10} & r_{4,11} & r_{4,12} \end{bmatrix} \end{cases}_R \begin{bmatrix} dVth \\ dIdlin \\ dIdsat \\ dDIBL \\ dVth * dIdlin \\ dVth * dIdsat \\ dVth * dDIBL \\ dIdlin * dIdsat \\ dIdsat * dDIBL \\ dVth * dVth \\ dIdlin * dIdlin \\ dIdsat * dIdsat \\ dDIBL * dDIBL \end{bmatrix}_{\Delta E}$$

CONSTRUCTING MAPPING BETWEEN MODEL PARAMETERS AND ELECTRICAL PARAMETERS

TECHNICAL FIELD

This disclosure relates generally to integrated circuits, and more particularly to the methods and algorithms for constructing mapping between model parameters and electrical parameters of integrated circuits.

BACKGROUND

In the design of integrated circuits, designers need to simulate the performance of the integrated circuits that are being designed. Various simulation tools are available for such a task. For example, Simulation Program with Integrated Circuit Emphasis (SPICE) is a well-known simulation tool designed for this task. The simulation tools need model parameters in order for them to simulate electrical behaviors of the integrated circuits.

FIG. 1 illustrates a work flow in a conventional model constructing and simulation process. In step 100, I-V fitting steps are performed to construct an original set of model parameters (block 102). The original model parameters 102 need to be fine-tuned (step 104) through a plurality of iterations before they can be used by designers. This often takes days or weeks to finish. The refined model parameters are provided to simulation tool 107 (step 106), and designers may use simulation tool 107 to simulate the integrated circuits (block 108).

Situations often occur that the model parameters do not accurately reflect the integrated circuits being designed. Also, the target circuit specification may be updated, which means that the target electrical parameters such as Idsat, Idlin, Vth, and Ioff need to be changed (block 110). This requires the model parameters to be changed to fit the updated target electrical parameters. Accordingly, step 104 needs to be performed again using the new target electrical parameters. Again, step 104 may take days or weeks to finish. Currently, there is no efficient way to quickly generate real-time model parameters from new target electrical parameters.

SUMMARY

In accordance with one aspect, a method includes determining a mapping between model parameters and electrical parameters of integrated circuits. The model parameters are configured to be used by a simulation tool. A set of electrical parameters is provided, and the mapping is used to map the set of electrical parameters to a set of model parameters.

Other embodiments are also disclosed.

BRIEF DESCRIPTION OF THE DRAWINGS

For a more complete understanding of the embodiments, and the advantages thereof, reference is now made to the following descriptions taken in conjunction with the accompanying drawings, in which:

FIG. 4 schematically illustrates the generation of output variables in the model space from input variables in the electrical space, wherein model parameters may be written as functions of electrical parameters.

FIGS. 5A through 6 illustrate various matrixes and functions for mapping electrical parameters to model parameters;

DETAILED DESCRIPTION OF ILLUSTRATIVE EMBODIMENTS

The making and using of the embodiments of the disclosure are discussed in detail below. It should be appreciated, however, that the embodiments provide many applicable inventive concepts that can be embodied in a wide variety of specific contexts. The specific embodiments discussed are merely illustrative, and do not limit the scope of the disclosure.

A novel method and an algorithm for generating model parameters from electrical parameters are provided, wherein the model parameters are used by circuit simulation tools. The variations and the operation of the embodiments are discussed. Throughout the various views and illustrative embodiments, like reference numbers are used to designate like elements.

Figure 1:
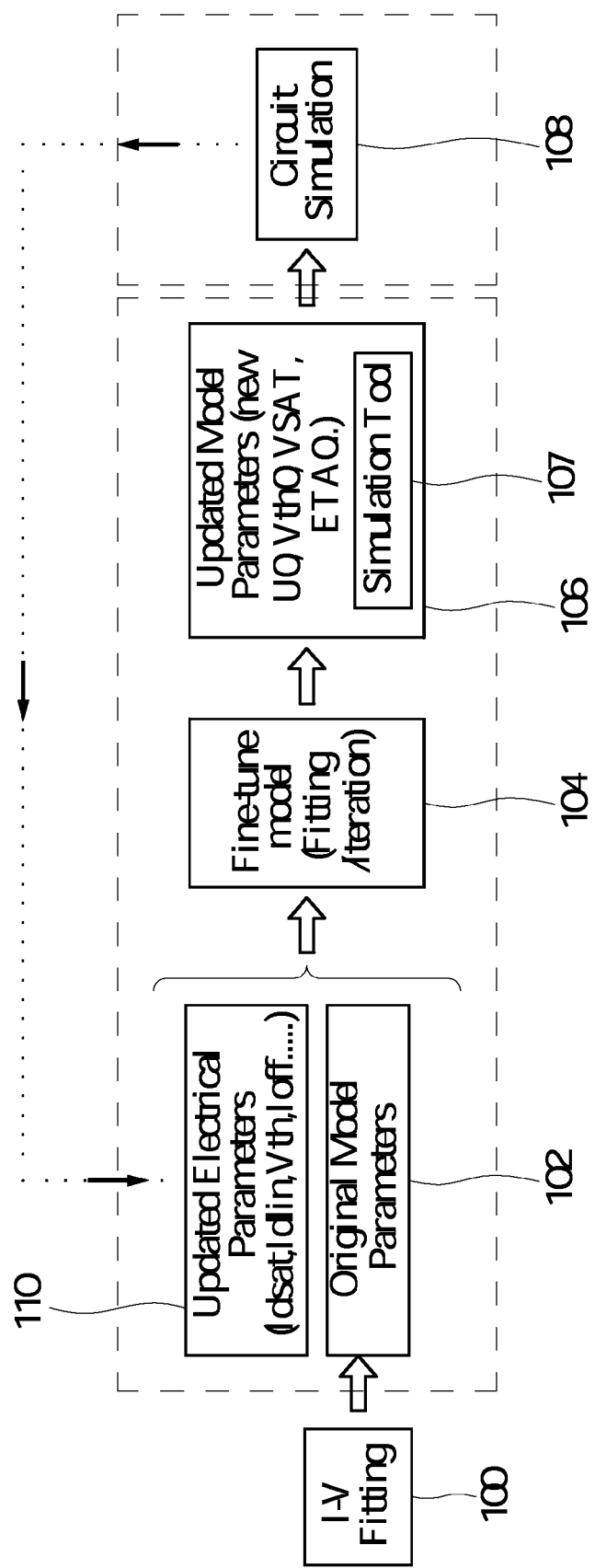
FIG. 1 illustrates a work flow in a conventional model constructing and simulation process.
Figure 2:
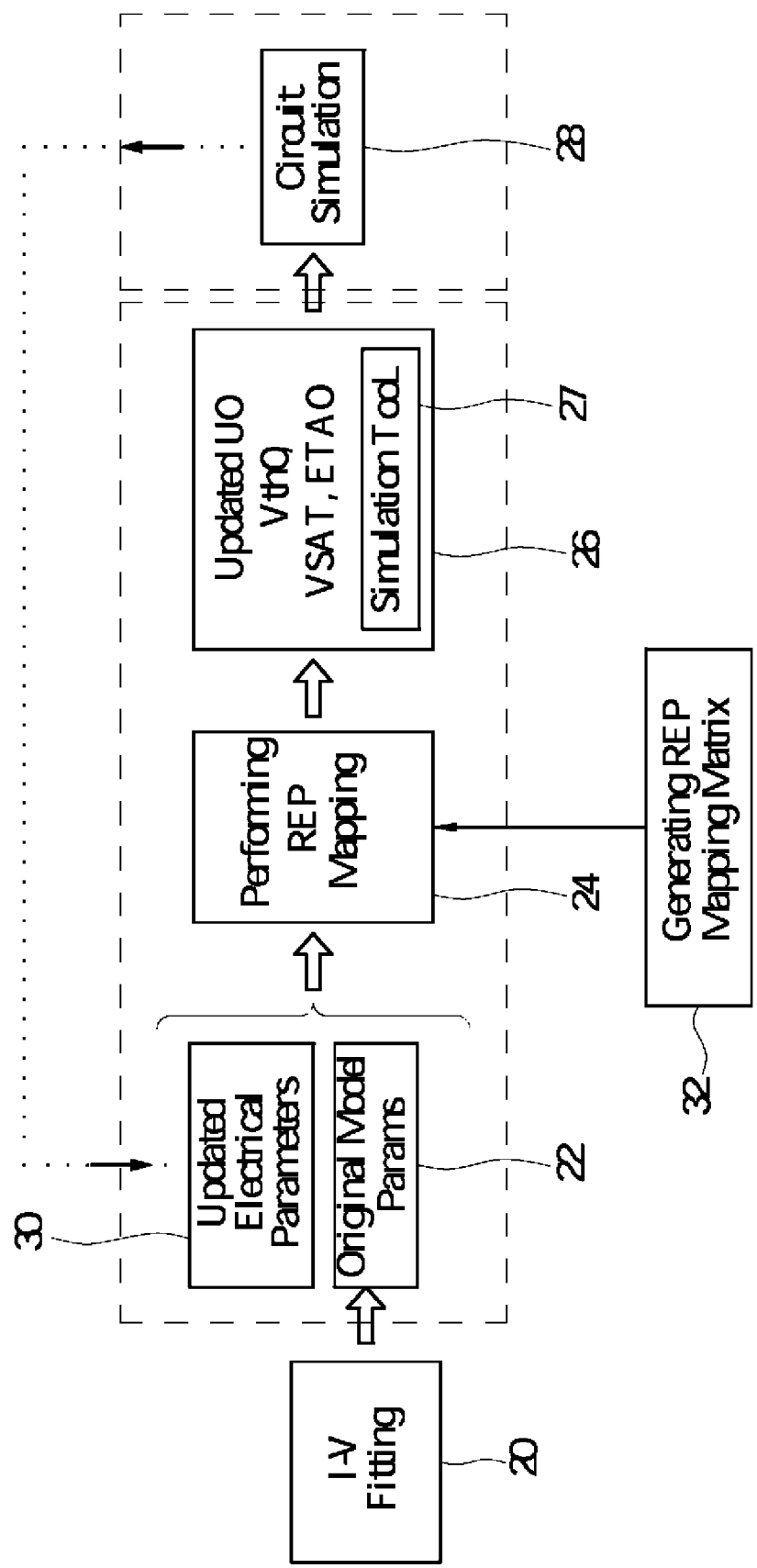
FIG. 2 illustrates a work flow in accordance with an embodiment.

FIG. 2 illustrates a work flow in accordance with an embodiment. In step 20, I-V fitting steps are performed to construct an original set of model parameters (block 22), which may be used by simulation tool 27. Simulation tool 27 may be a Simulation Program with Integrated Circuit Emphasis (SPICE) simulator or any other simulation tool. Further, the model, whose model parameters are to be generated in accordance with embodiments, may be any model such as a Berkeley Short-channel IGFET Model (BSIM) model, a Penn State Philips (PSP) model, or the like. In this step, an original set of target electrical parameters (specification) may be provided and used in the I-V fitting to ensure the target electrical parameters are met. The original set of electrical parameters may comprise, but not limited to, linear threshold voltage Vthlin, linear current Idlin, saturated current Idsat, drain induced barrier lowering (DIBL), and the like. Next, a Response to Electrical Parameters (REP) mapping step (step 24) is performed to map the original set of electrical parameters to a set of model parameters, which may comprise, but is not limited to, threshold voltage Vth0, saturation electron velocity Vsat, mobility U0, DIBL parameter ETA0, and the like. The mapping may be performed using a software running on a computer, and may be finished in a very short period of time, for example, within several milliseconds. The details of the mapping are shown in FIGS. 5A through 6. In an embodiment, the model parameters generated in steps 22 and 24 may be compared with each other to ensure the may reflect the target electrical parameters. In alternative embodiments, step 22 is performed, while step 24 is skipped. In step 26, the generated model parameters are provided to (or read into) simulation tool 27, and designers may use simulation tool 27 to simulate the electrical performance of integrated circuits in circuit design. The entering/reading of the generated model parameters into simulation tool 27 may be performed manually by designers, or performed automatically by a computer.

If one or more of the target electrical parameters such as Idsat, Idlin, Vth, and Ioff is updated (block 30), the model parameters also need to be modified to fit the updated target electrical parameters. Accordingly, step 24 is performed to map the new target electrical parameters to new model parameters. This step can be quickly performed, for example, in a matter of seconds or even milliseconds. The newly generated model parameters may then be provided to simulation tool 27 to perform simulations.

It is observed that by using the embodiments, designers can modify electrical parameters, and the respective model parameters corresponding to the electrical parameters may be quickly generated. Also, designers do not need to wait for days or weeks for the generation of new model parameters.

Figure 3:
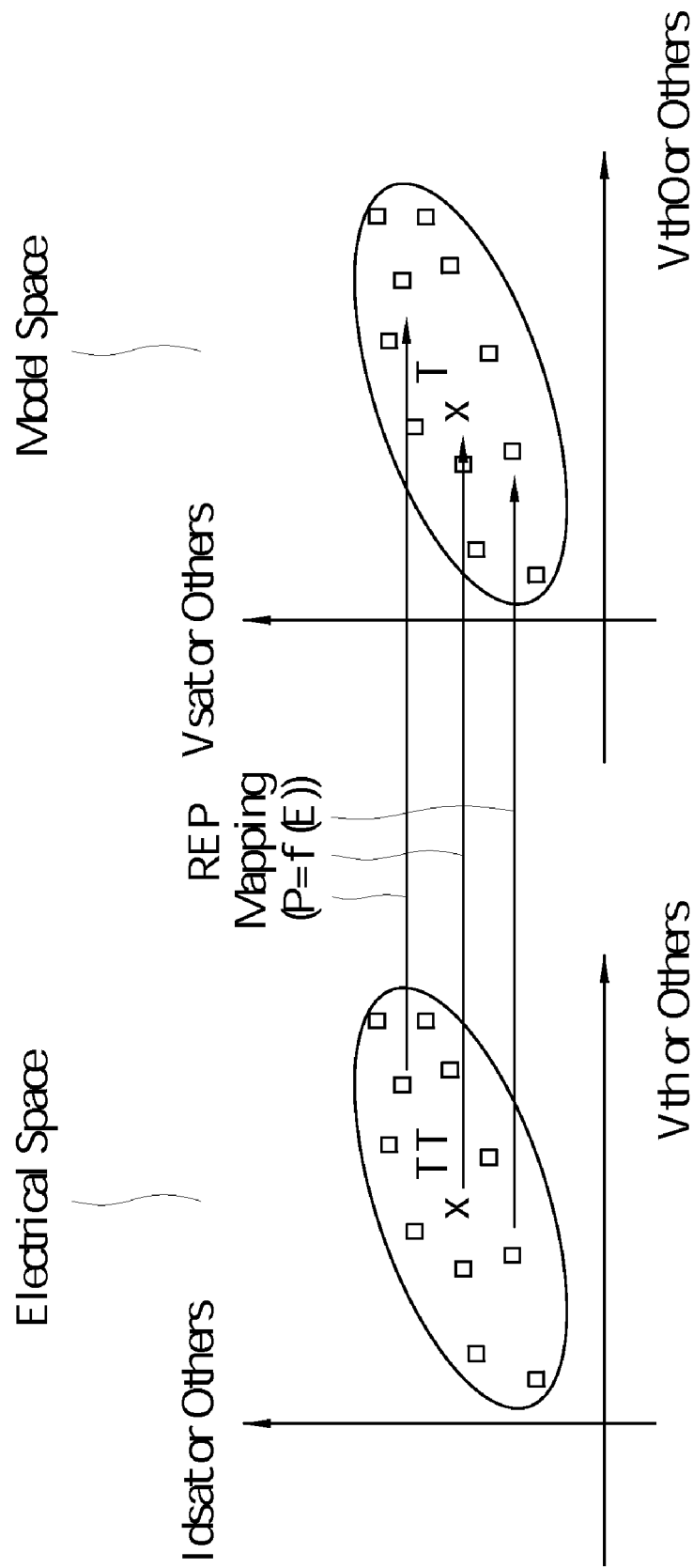
FIG. 3 illustrates the mapping between an electrical space and a model space.

FIG. 3 illustrates the concept of the REP mapping, which is generated through step 32 in FIG. 2. An electrical space may be used to represent the electrical parameters, with the X axis and the Y axis representing any of the electrical parameters including, but not limited to, DC and AC electrical parameters such as Vthlin (Vth), Idlin, Idsat, DIBL, and the like. Each set of electrical parameters may be represented by one point in the electrical space (or E space), wherein each set of electrical parameter values may include a Vth value, an Idlin value, an Idsat value, a DIBL value, and the like. Similarly, model parameters including, but not limited to, Vth0, U0, Vsat, ETA0, and the like may be represented in a model space (or a P space), wherein the X axis and the Y axis represent model parameters. Each set of model parameters may be represented by one point in the model space, wherein each set of model parameters may include a set of values including a Vth0 value, a U0 value, a Vsat value, an ETA0 value, and the like. The REP mapping is used to generate the model parameters from electrical parameters.

FIG. 3 also illustrates that the model parameters are no longer a single point in the model space as in conventional modeling methods. Rather, it may be a region (the shaded region), wherein the model parameters may be represented by any point in the region. Similarly, the electrical parameters are no longer a single point in the electrical space. It is also a region (the shaded region), which region may surround a point representing electrical parameters of a sample chip at a typical-typical (TT) process corner. Any point in the electrical space may be mapped to a point in the model space with the (one-to-one) REP mapping, as symbolized by arrows.

FIG. 4 schematically illustrates the generation of output variables (which are model parameters) Vth0, U0, Vsat, and ETA0 through input variables (which are electrical parameters) Vthlin, Idlin, Idsat, and DIBL, wherein the output variables are shown as functions Fvth0, FU0, Fvsat, and FETA0. The REP mapping from electrical parameters in the electrical space to model parameters P in the model space is also shown in FIG. 3 as P=f(E), indicating that the model parameters P are functions of electrical parameters E.

It is realized that the REP mapping may be implemented in various methods, including a table-based mapping, an equation-based mapping, and a hybrid mapping. In the table-based mapping, values of electrical parameters and the respective model parameters are stored in tables. This, however, requires a huge storage space. In the equation-based mapping, equations are formed to express the model parameters as functions of electrical parameters, as shown as equation P=f(E) in FIG. 3. In the hybrid mapping, the table-based mapping and the equation-based mapping are combined.

FIGS. 5A and 5B illustrate equation-based mapping schemes. Referring to FIG. 5A, matrix R is used to represent the relationship between model parameter, which are represented as vector P, and electrical parameters, which are represented as vector E. From FIG. 5A, it is observed that if REP mapping matrix R is known, then from any electrical parameter E, model parameters P can be easily calculated. The calculation of model parameters P from electrical parameter E and REP mapping matrix R is shown as step 24 in FIG. 2, while the generation of REP mapping matrix R is shown as step 32 in FIG. 2.

In FIG. 5A, electrical parameters Vth, Idlin, Idsat, and DIBL are first order parameters. Using first order electrical parameters, a REP mapping matrix R may be found, and the respective model parameters P may, or may not, accurately reflect the electrical behavior of integrated circuits. High order (second order, third order, or the like) parameters f1(Vth, Idlin, Idsat, DIBL), f2(Vth, Idlin, Idsat, DIBL), f3(Vth, Idlin, Idsat, DIBL), and f4(Vth, Idlin, Idsat, DIBL) may then be added into vector E to reflect the non-linear behavior of the response of model parameters P to electrical parameters E. The high order parameters may be in the form of Taylor expansions. Further, the expression of high order parameters may be collected from various sources, for example, from articles describing behaviors of integrated circuits. In an exemplary embodiment, high order parameter f1(Vth,Idlin,Idsat,DIBL) may be expressed as Vth*Idlin, high order parameter f2(Vth,Idlin,Idsat,DIBL) may be expressed as Vth*Idsat, high order parameter f3(Vth,Idlin,Idsat,DIBL) may be expressed as Vth*DIBL, and high order parameter f4(Vth,Idlin,Idsat,DIBL) may be expressed as Idsat*DIBL.

FIG. 5B illustrates an alternative expression for the REP mapping between electrical parameters and model parameters. The electrical parameters are expressed as relative values ΔE rather than absolute values E, wherein the relative values are the deviation of electrical parameters E from a reference point in the electrical space (FIG. 3). The reference point may be the electrical parameters measured from sample at typical-typical corner TT in FIG. 3. For example, if the threshold voltage at the reference point in the electrical space is Vth_ref, then value dVth0 in FIG. 5B equals Vth0 (as in FIG. 5A) minus Vth_ref. Similarly, model parameters may be expressed as relative values ΔP deviated from a reference point in the model space. FIG. 6 illustrates an exemplary expression with high order parameters integrated into the expression in FIG. 5B. In FIG. 6, the high order electrical parameters include first order and second order parameters.

In FIGS. 5A through 6, the high order effects are taken into account in the form of high order electrical parameters. In alternative embodiments, the high order effects may be taken into account in the form of high order model parameters. The high order model parameters may be the inverse function of the high order electrical parameters. Whether the high-order effects are expressed in the form of high order electrical parameters or in the form of high order model parameters depends on which expression makes the REP mapping simpler.

Figure 7:
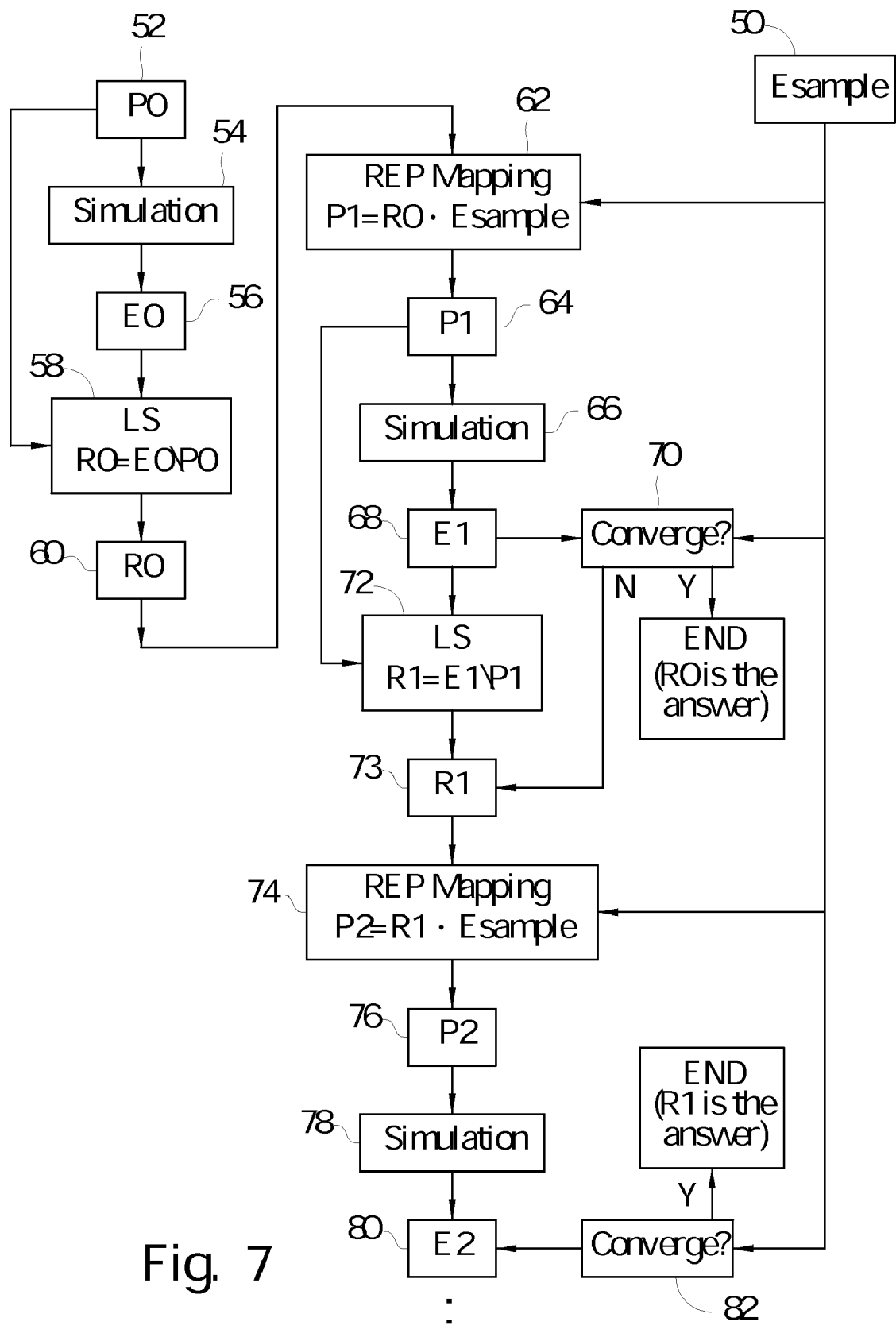
FIG. 7 illustrates a flow chart for efficiently generating a mapping matrix.

FIG. 7 illustrates a work flow for determining REP mapping matrix R (FIGS. 5A through 6), wherein the work flow in FIG. 7 is also represented as step 32 in FIG. 3. First, in step 50, a plurality of samples are made, wherein the samples may be silicon chips including the integrated circuits whose models are to be established. Further, the samples are selected so that they reflect the part of the electrical space that is cared by the designers. For example, if the layout-effect model is to be established, then the samples will have different layout effects (such as different layout parameters including SA and SB, which are gate-poly-edge to STI spacings). The electrical parameters measured from the samples thus will be scattered throughout the part of the electrical space that is cared by the designers. The plurality of sets of electrical parameters measured from the plurality of samples is in combination referred to as Esample.

In step 52, an initial model parameter set P0 is assumed, wherein parameter set P0 includes a plurality of points in the model space (FIG. 4). Each point in the model space may be represented by one vector P (or ΔP, which is a set of model parameters) as shown in FIGS. 5A through 6. Each of the point in initial model parameter set P0 is provided to simulation tool 27 (FIG. 2) to generate (step 54) a point (a set of electrical parameters) in the electrical space, wherein each point in the electrical space may be represented by one vector E (or ΔE) as shown in FIGS. 5A through 6. The collection of the plurality of generated points in the electrical space is represented as E0 as in block 56.

Next, in step 58, an initial REP mapping matrix R0 is calculated as R0=E0\P0 (block 60). R0 may be calculated using the well-known least square (LS) optimization method, which is provided in various tools such as a Matlab tool. Accordingly, the details of the calculation are not discussed herein. It is realized that initial REP mapping matrix R0 is not obtained from the part of the electrical space cared (required) by the designers. Accordingly, initial REP mapping matrix R0 may, or may not, be the one reflecting the space of Esample. Steps 62 through 80 are then performed to fine-tune REP mapping matrix R to the electrical space of Esample.

Referring to step 62, model parameters P1 is calculated as a product using equation P1=R0·Esample (also refer to FIGS. 5A through 6). Since electrical parameters Esample include multiple points in the electrical space, the calculated model parameters P1 (block 64) also include a plurality of points in the model space, which may be represented using a plurality of vectors similar to vectors P in FIGS. 5A through 6. Calculated model parameters P1 are provided to simulation tool 27 to simulate and generate (step 66) electrical parameters E1 (block 68). Electrical parameters E1 is then compared (step 70) with initial electrical parameters Esample. If the difference between each value of electrical parameters E1 and the respective value of initial electrical parameters Esample is smaller than a pre-determined percentage, for example, 10 percent, it is determined that the calculation converges, and the converge status is true. This indicates that the initial REP mapping matrix R0 reflects the part of the electrical space of Esample. The determination of the REP mapping matrix R is thus finished, and initial REP mapping matrix R0 is used as REP mapping matrix R as in step 24 of FIG. 3 and in the equations shown in FIGS. 5A through 6.

If electrical parameters E1 do not converge with initial electrical parameters Esample (the converge status being false), initial REP mapping matrix R0 needs to be further fine-tuned. Referring to step 72, REP mapping matrix R1 (block 73) may be calculated as R1=E1/P1 using the LS method. Next, an REP mapping is performed in step 74 to find model parameters P2 (block 74) using equation P2=R1·Esample. Model parameters P2 are then provided to simulation tool 27 (FIG. 3) to simulate (step 78) electrical parameters E2 (block 80), which are further compared with Esample to find whether they converge (block 82), and whether REP mapping matrix R1 is the matrix R in FIGS. 5A through 6. If not, the steps between steps 72 and 82 are repeated until the simulated electrical parameters converge with electrical parameters Esample, and the resulting matrix will be matrix R as in FIGS. 5A and 6.

Figure 8:
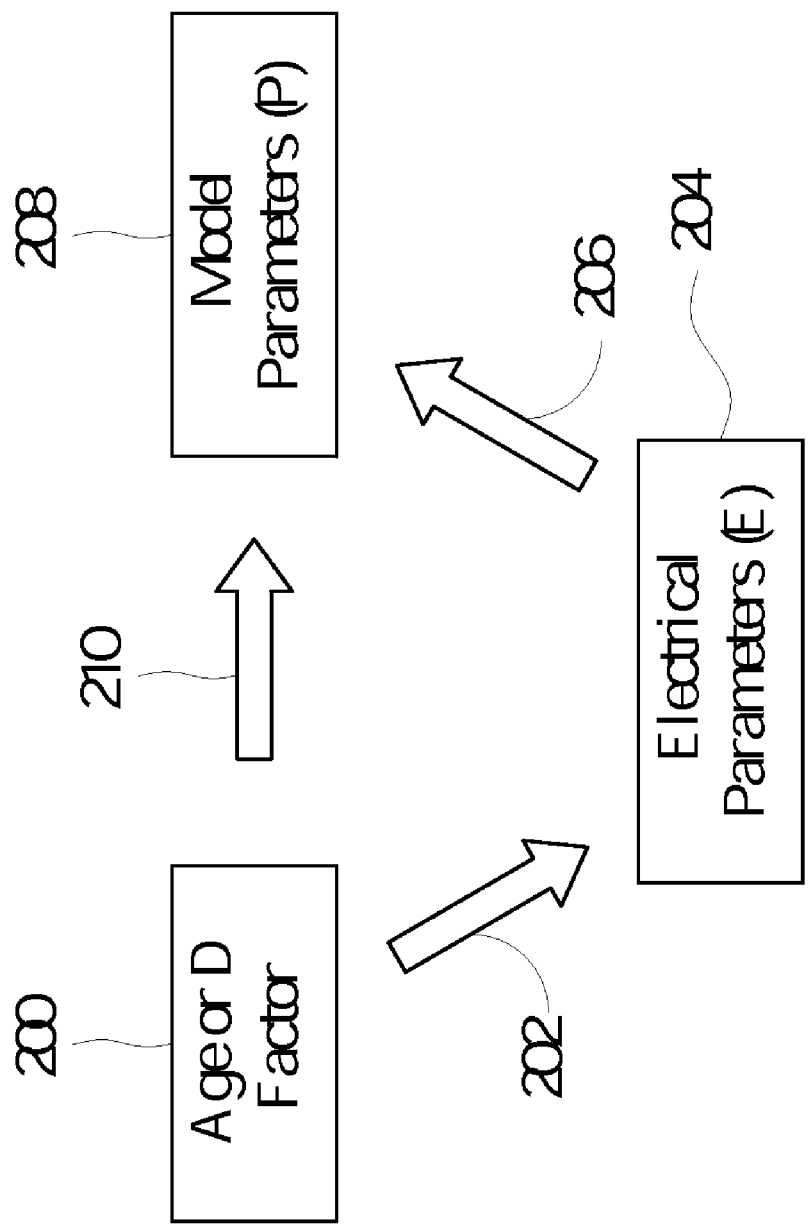
FIG. 8 illustrates an embodiment, which aging model parameters are generated.

With the embodiments provided, various applications can be made much easier. FIG. 8 illustrates in the generation of aging model parameters, such as hot carrier injection (HCI) model parameters or negative bias time independent (NBTI) model parameters. Conventionally, in the aging modeling, model parameters P (block 208) were directly expressed as the function of time (age) or degrade factor, known as D factor (block 200). This step is illustrated using arrow 210. It was very difficult to establish the direct correlation between the model parameters and time. In the embodiments, the determination of the model parameters is separated into two steps. First, electrical parameters E are expressed as the function of time (age) or degrade factor D. This step (step 202) may be performed by performing experiments on integrated circuits, and measuring how the electrical parameters E of the integrated circuits change with time. Second, electrical parameters E are mapped (step 206) to model parameters P using the REP mapping, wherein essentially the same method and steps as discussed in preceding paragraphs may be used. Through the two-step modeling, model fitting steps, which were required in conventional aging modeling, are no longer needed. Further, the accuracy of the aging modeling is improved, and the construction of the aging model becomes much easier than in conventional one-step modeling.

Figure 9:
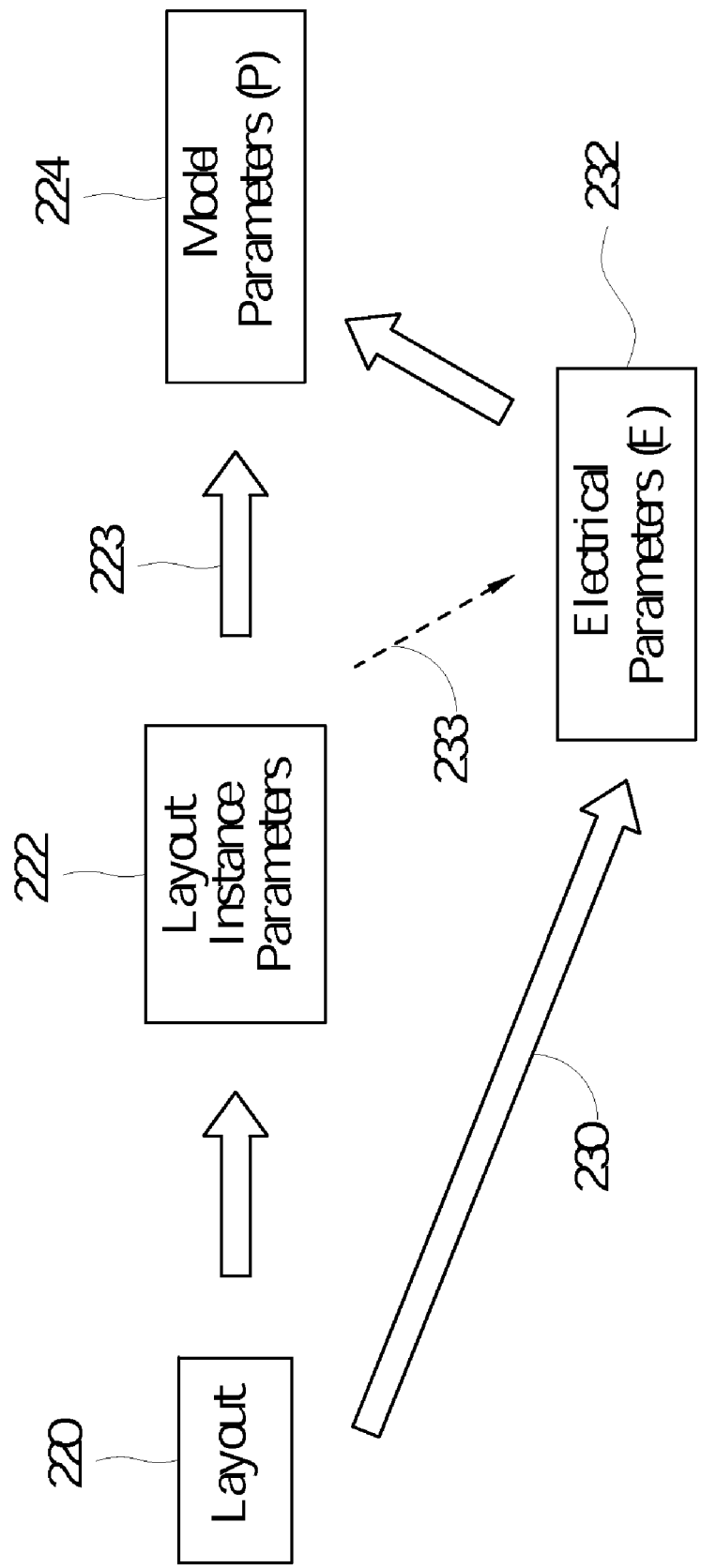
FIG. 9 illustrates an embodiment, which layout-effect model parameters are generated.

FIG. 9 illustrates using the embodiments in the generation of layout-effect model parameters. Conventionally, in the layout-effect modeling, layouts (block 220) of integrated circuits are represented using layout instance parameters such as SA, SB, and the like (block 222), and model parameters (block 224) were directly expressed as the function of layout instance parameters. This step is illustrated using arrow 223. It was very difficult to establish the direct correlation between model parameters and layout instance parameters. In the embodiments, the determination of model parameters P is separated into two steps. First, electrical parameters E (block 232) are expressed as the function of the layout of integrated circuits (step 230). Step 230 may be performed by forming integrated circuits with different layout parameters such as SA and SB, and measuring the integrated circuits, so that electrical parameters E are expressed as a function of layout parameters such as layout instance parameters (step 233). Second, the electrical parameters E are mapped to model parameters P using the REP mapping. Again, through the two-step modeling, the accuracy of the modeling is improved, and the construction of the layout-effect model becomes easy.

The embodiments provide an algorithm and steps for calculating REP mapping (which may be expressed as matrixes) between model parameters and electrical parameters, and using the REP mapping to adjust modeling in the simulation of integrated circuits. The time cycle for modifying models thus becomes much shorter. Further, the constructed models may accurately reflect the target electrical space cared by designers.

Although the embodiments and their advantages have been described in detail, it should be understood that various changes, substitutions and alterations can be made herein without departing from the spirit and scope of the embodiments as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:

1. A method comprising:
   determining a relation between model parameters and electrical parameters of integrated circuits by a mapping, wherein the model parameters are configured to be used by a simulation tool;
   providing a set of electrical parameters, wherein the electrical parameters comprise a first parameter selected from the group consisting essentially of linear threshold voltage Vthlin, linear current Idlin, saturated current Idsat, drain induced barrier lowering DIBL, and combinations thereof; and
   based on the mapping, using a computer to map the set of electrical parameters to a set of model parameters, wherein the model parameters comprise a second parameter selected from the group consisting essentially of threshold voltage Vth0, saturation electron velocity Vsat, mobility U0, and DIBL parameter ETA0, and combinations thereof.

2. The method of claim 1, wherein the mapping is expressed as a matrix, and wherein the set of model parameters is mapped by calculating a product of the matrix and the set of electrical parameters, with the set of model parameters being expressed as a vector.

3. The method of claim 2 further comprising:
   assuming a plurality of sets of initial model parameters;
   using the simulation tool to simulate a plurality of sets of electrical parameters, wherein each set in the plurality of sets of electrical parameters is simulated from one set in the plurality of sets of initial model parameters; and
   using a least square (LS) optimization method to calculate the matrix from the plurality of sets of initial model parameters and the plurality of sets of electrical parameters.

4. The method of claim 3 further comprising:
   measuring a plurality of samples to obtain a plurality of sets of sample electrical parameters;
   calculating a product of the matrix and the plurality of sets of sample electrical parameters, wherein the product comprises a plurality of calculated model parameters;
   simulating a plurality of sets of simulated electrical parameters using the plurality of calculated model parameters;
   comparing the plurality of sets of simulated electrical parameters with the plurality of sets of sample electrical parameters to determine a converge status;
   adopting the matrix as being the mapping when the converge status is true; and
   when the converge status is false, updating the matrix using a least square optimization method from the plurality of sets of simulated electrical parameters and the plurality of calculated model parameters.

5. The method of claim 1, wherein the mapping is expressed as a matrix, and wherein during the step of determining the mapping between the model parameters and the electrical parameters, both first order electrical parameters and high order parameters are used in a calculation of the matrix.

6. The method of claim 1, wherein the set of model parameters is aging model parameters, and wherein the method further comprises establishing the set of electrical parameters as a function of an age of the integrated circuits, and wherein the set of model parameters is not expressed as a function of the age.

7. The method of claim 1, wherein the set of model parameters is layout-effect model parameters, and wherein the method further comprises establishing the set of electrical parameters as a function of layouts of the integrated circuits, and wherein the set of model parameters is not expressed as a function of layout instance parameters.

8. The method of claim 1, wherein the step of using the mapping to map the set of electrical parameters to the set of model parameters is performed by a software, and wherein the method further comprises entering the set of model parameters into the simulation tool.

9. The method of claim 1, wherein the electrical parameters comprise linear threshold voltage Vthlin, linear current Idlin, saturated current Idsat, drain induced barrier lowering DIBL, and the model parameters comprise threshold voltage Vth0, saturation electron velocity Vsat, mobility U0, and DIBL parameter ETA0.

10. A method comprising:
    providing a set of electrical parameters;
    calculating a matrix for mapping from electrical parameters of integrated circuits to model parameters, wherein the model parameters are configured to be used by a simulation tool, and wherein the method of calculating the matrix is performed using an iterated least square (LS) optimization method;
    calculating using a computer a set of model parameters as a product of the set of electrical parameters and the matrix, wherein the set of electrical parameters is expressed as a vector; and
    entering the set of model parameters into the simulation tool.

11. The method of claim 10, wherein the step of calculating the matrix comprises:
    determining a plurality of sets of initial model parameters;
    using the simulation tool to simulate a plurality of sets of electrical parameters, wherein each set in the plurality of sets of electrical parameters is simulated from one set in the plurality of sets of initial model parameters; and
    using the LS optimization method to calculate the matrix from the plurality of sets of electrical parameters and the plurality of sets of initial model parameters.

12. The method of claim 11 further comprising:
    measuring a plurality of sample chips to obtain a plurality of sets of sample electrical parameters;
    calculating a product of the matrix and the plurality of sets of sample electrical parameters, wherein the product comprises a plurality of sets of calculated model parameters;
    simulating a plurality of sets of simulated electrical parameters using the plurality of sets of calculated model parameters;
    comparing the plurality of sets of simulated electrical parameters with the plurality of sets of sample electrical parameters to determine a converge status;
    using the matrix to perform the step of calculating the set of model parameters when the converge status is true; and
    when the converge status is false, updating the matrix as a quotient of the plurality of sets of simulated electrical parameters divided by the plurality of calculated model parameters, wherein the quotient is calculated using the LS optimization method.

13. The method of claim 10, wherein during the step of calculating the matrix, both first order electrical parameters and high order electrical parameters are used.

14. The method of claim 10, wherein the set of model parameters comprises aging model parameters, and wherein the method further comprises establishing the set of electrical parameters as a function of an age of the integrated circuits, and wherein the set of model parameters is not expressed as a function of the age.

15. The method of claim 10, wherein the set of model parameters comprises layout-effect model parameters, and wherein the method further comprises establishing the set of electrical parameters as a function of layouts of the integrated circuits, and wherein the set of model parameters is not expressed as a function of layout instance parameters.

16. The method of claim 10, wherein the step of calculating the set of model parameters is performed by a software, and wherein the method further comprising entering the set of model parameters into the simulation tool.

17. The method of claim 10, wherein the set of electrical parameters comprises linear threshold voltage Vthlin, linear current Idlin, saturated current Idsat, drain induced barrier lowering (DIBL), and the set of model parameters comprises threshold voltage Vth0, saturation electron velocity Vsat, mobility U0, and DIBL parameter ETA0.

18. A method comprising:
    establishing a set of electrical parameters of an integrated circuit as a function of a parameter selected from the group consisting essentially of an age of the integrated circuit and a degrade factor;
    calculating a matrix for mapping from electrical parameters of integrated circuits to model parameters, wherein the model parameters are configured to be used by a simulation tool;
    calculating using a computer a set of model parameters as a product of the set of electrical parameters and the matrix; and
    reading the set of model parameters into the simulation tool.

19. The method of claim 18, wherein the set of electrical parameters and the set of model parameters are expressed as vectors in the step of calculating the set of model parameters.

20. The method of claim 19, wherein the vectors comprise:
    first order parameters selected from the group consisting essentially of first order electrical parameters and first order model parameters; and
    high order parameters selected from the group consisting essentially of high order electrical parameters and high order model parameters.

* * * * *